(12) United States Patent
Nahif et al.

(10) Patent No.: US 12,146,214 B2
(45) Date of Patent: Nov. 19, 2024

(54) METHOD FOR PRODUCING IMPROVED COLD-FORMING TOOLS FOR HIGH-STRENGTH AND SUPER-HIGH-STRENGTH STEELS, AND COLD-FORMING TOOL

(71) Applicant: voestalpine eifeler Vacotec GmbH, Düsseldorf (DE)

(72) Inventors: Farwah Nahif, Düsseldorf (DE); Mark Falkingham, Düsseldorf (DE)

(73) Assignee: VOESTALPINE EIFELER VACOTEC GMBH, Düsseldorf (DE)

( * ) Notice: Subject to any disclaimer, the term of this patent is extended or adjusted under 35 U.S.C. 154(b) by 147 days.

(21) Appl. No.: 17/612,028

(22) PCT Filed: May 15, 2020

(86) PCT No.: PCT/EP2020/063702
§ 371 (c)(1),
(2) Date: Nov. 17, 2021

(87) PCT Pub. No.: WO2020/234186
PCT Pub. Date: Nov. 26, 2020

(65) Prior Publication Data
US 2022/0205078 A1 Jun. 30, 2022

(30) Foreign Application Priority Data
May 17, 2019 (DE) ................. 10 2019 113 117.0

(51) Int. Cl.
| | | |
|---|---|---|
| *C23C 14/06* | (2006.01) | |
| *B21D 37/10* | (2006.01) | |
| *C23C 14/00* | (2006.01) | |
| *C23C 14/02* | (2006.01) | |
| *C23C 14/32* | (2006.01) | |
| *C23C 28/04* | (2006.01) | |

(52) U.S. Cl.
CPC .......... *C23C 14/0641* (2013.01); *B21D 37/10* (2013.01); *C23C 14/0084* (2013.01); *C23C 14/024* (2013.01); *C23C 14/325* (2013.01); *C23C 28/044* (2013.01)

(58) Field of Classification Search
None
See application file for complete search history.

(56) References Cited

U.S. PATENT DOCUMENTS

| | | | |
|---|---|---|---|
| 8,746,027 B2 | 6/2014 | Cha | |
| 9,211,588 B2 | 12/2015 | Setoyama et al. | |
| 9,394,601 B2 * | 7/2016 | Park | ....................... C23C 28/044 |
| 2009/0123737 A1 | 5/2009 | Yasui et al. | |
| 2009/0241632 A1* | 10/2009 | Young | .................... B21D 37/20 |
| | | | 72/470 |
| 2010/0258612 A1 | 10/2010 | Kolbeck et al. | |
| 2013/0101818 A1 | 4/2013 | Cha et al. | |
| 2014/0041435 A1 | 2/2014 | Cha | |
| 2019/0040519 A1* | 2/2019 | Sato | ........................ C23C 28/42 |
| 2020/0055790 A1 | 2/2020 | Setoyama et al. | |

FOREIGN PATENT DOCUMENTS

| | | |
|---|---|---|
| AT | 506 133 A1 | 6/2009 |
| CA | 2 665 044 A1 | 4/2008 |
| DE | 10 2009 018 813 A1 | 10/2010 |
| EP | 2 082 079 B1 | 3/2007 |
| JP | 2007283479 A | 11/2007 |
| JP | 2008142800 A | 6/2008 |
| JP | 2011011287 A | 1/2011 |
| JP | 2015058503 A | 3/2015 |
| JP | 2017159424 A | 9/2017 |

OTHER PUBLICATIONS

Juan et al. "Effect of weld heat input on toughness and structure of HAZ of a new super-high strength steel". Bull. Mater. Sci., vol. 26, No. 3, Apr. 2003, pp. 301-305 (Year: 2003).*
Li et al. Microstructure, mechanical and thermal properties of TiAlN/CrAlN multilayer coatings. Int. Journal of Refractory Metals and Hard Materials 40 (2013) 51-57 (Year: 2013).*
Espacenet bibliographic data and English Translation for JP2007283479A, published Nov. 1, 2007 25 pages.
Espacenet bibliographic data and English Translation for JP2008142800A, published Jun. 26, 2008 17 pages.
Espacenet bibliographic data and English Translation for JP2017159424A, published Sep. 14, 2017 20 pages.
Espacenet bibliographic data and English Translation for JP2015058503, published Mar. 30, 2015 24 pages.
Espacenet bibliographic data and English Translation for JP2011011287, published Jan. 20, 2011 27 pages.
International Search Report for PCT/JP2017/033962 dated Oct. 24, 2017 4 pages.
International Search Report for PCT/EP2020/063702 dated Jul. 23, 2020, 4 pages.
Office Action for DE 10 2019 113 117.0 dated Jan. 14, 2020, 7 pages (Not in English).
Written Opinion for PCT/EP2020/063702 dated Nov. 26, 2020, 5 pages.
Esapacenet bibliographic data and EN Abstract or DE 10 2009 018 813 published Oct. 28, 2010, 1 page.
English Translation of DE Office Action for DE application No. 10 2019 113 117.0 dated Jan. 14, 2020, 4 pages.
English Translation of Written Opinion for PCT/EP2020/063702 dated Nov. 26, 2020, 3 pages.

* cited by examiner

*Primary Examiner* — Jose I Hernandez-Kenney
(74) *Attorney, Agent, or Firm* — Sand, Sebolt & Wernow Co., LPA

(57) ABSTRACT

The invention relates to a method for producing a cold forming tool, particularly for cold forming super-high-strength steels, wherein the cold forming tool is the upper and/or lower tool of a forming tool set, wherein the cold forming tool is made of a metal material and has a forming surface that is designed so that a formed metal sheet has the desired final contour of the component, characterized in that a hard material layer is deposited on the forming surface of the forming tool by means of physical gas-phase deposition, wherein the hard material layer consists of a titanium nitride adhesive layer and alternating layers of aluminum titanium nitride and aluminum chromium nitride deposited thereon, wherein a titanium nitride top layer or alternatively a titanium carbon nitride top layer is deposited as the final layer as the outermost outer surface oriented toward a workpiece that is to be formed.

9 Claims, 3 Drawing Sheets

METHOD FOR PRODUCING IMPROVED COLD-FORMING TOOLS FOR HIGH-STRENGTH AND SUPER-HIGH-STRENGTH STEELS, AND COLD-FORMING TOOL

The invention relates to a method for producing cold forming tools, particularly for cold forming super-high-strength steels and to the cold forming tool for doing so.

Particularly in automotive engineering, there is a continual endeavor to make vehicle bodies ever lighter in weight. In the last few years, efforts in this area have led to the production of high-strength steel components, for example by means of press hardening methods, which because of their high strength require comparatively low material thicknesses and thus weights. Now, particularly for reasons of environmental protection and reducing fuel consumption, lightweight construction is a top priority for automobile manufacturers. In particular, so-called high-strength, super-high-strength, and ultra-high-strength steel materials are being used (UHSS—ultra-high-strength steel, AHSS—advanced-high-strength steel). For the purposes of this application, the term "high-strength steel" relates to steel materials with a tensile strength of more than 350 MPa, in particular more than 600 MPa. These materials are particularly used to produce components such as bumper reinforcements, side impact bars, seat frames and mechanisms, as well as chassis components.

With materials of this kind, the weight can be reduced by up to 40% compared to conventional components. It is also possible to reduce costs and increase production efficiency.

There are two main processes used in the forming of metals, namely hot forming and cold forming.

"Hot forming" refers to all of the forming steps that take place above the recrystallization temperature of a metal. In general, lower forming forces are required for it; in addition, no cold work hardening of the workpiece occurs during the forming.

In this connection, $Al_2O_3$-based solutions are often used for the hot forming tools, which, due to their oxidic components, increase the hot hardness and oxidation resistance of the overall coating for the high-temperature application of hot forming. These oxidic layers, however, are hard and brittle. Usually, the purpose of coatings on hot forming tools is to allow them to withstand the thermal stress and to also function as a diffusion barrier.

One challenge in this context, however, is the cold forming of such super-high-strength steels.

Because of their properties, these materials resist the forming tools with considerably higher forces than would be the case with conventional auto body steel.

Because of the high contact pressures that occur between the workpiece and tool during the cold forming of super-high-strength steels, in particular the tribological stresses on the tools are very high. For this reason, PVD layers are used in cold forming, which are focused on increasing the mechanical load capacity, increasing wear, and reducing crack propagation, instead of relying on oxidic layers—as in hot forming—which have a higher hot hardness in order to counteract thermal fatigue in the tools. Since economical production requires tools with long service lives, it is necessary to ensure that the wear due to the extremely high contact stresses in the normal direction is reduced. For cold forming, one approach in this context is to pretreat workpieces and in particular to also add lubricants containing high levels of additives.

The addition of lubricants can have negative effects on worker health since when they are used, lubricant emissions can get into the workers' breathing air and onto their skin at their work stations. In addition, this can result in the spread of cold lubricants into the area surrounding the machine, which further degrades the life cycle assessment of the entire process.

The object of the invention is to create a method that can be used to produce cold forming tools, which exhibit a reduced wear propensity and whereby it is possible to significantly increase tool service life. Another object of the invention is to reduce the lubrication expense in forming processes, particularly of super-high-strength steels.

The object is attained with a method having the features of claim 1.

Advantageous modifications are disclosed in the subclaims that are dependent thereon.

Another object is to create a corresponding cold forming tool.

This object is attained with a cold forming tool having the features of claim 9.

Advantageous modifications are disclosed in the subclaims that are dependent thereon.

The invention relates to the particular requirements in cold forming processes due to the high forming forces, particularly in the cold forming of super-high-strength steels. To meet these requirements, the cold forming tool according to the invention is provided with a multilayer hard material layer composed of an applied titanium nitride adhesive layer and layers of aluminum titanium nitride and aluminum chromium nitride that are deposited thereon. By means of this specific multilayer structure, it is possible to achieve the strength and loadbearing capacity of the overall coating, which is required by the application of cold forming super-high-strength sheet metals.

In addition, the crack growth, which is observed with the high strain forces in the cold forming of super-high-strength sheet metals, can be stopped by the overall coating due to the alternating layers of aluminum titanium nitride and aluminum chromium nitride in that the cracks are stopped at the transitions between the individual layers due to their differing microstructures. In order to reduce the breakaway torque, a top layer of titanium nitride or alternatively titanium carbon nitride is provided as a top layer.

In the original German description, the terms "Schicht," "Layer," and "Lage" are used synonymously refer to a single layer of the multilayer composite coating.

The focus of the present invention is the mechanical and tribological requirements of cold forming in which the hot hardness and oxidation resistance of the overall coating and individual layers are negligible due to the application of cold forming. Oxidic layers are extremely hard and brittle. In the cold forming, the main stress on the tool is produced by the powerful forming forces occurring and by the cold work hardening, as a result of which the use of oxidic layers, whose advantages lie in their thermal resistance, is less common and more focus is being placed on wear-resistant nitride-based multilayer coatings, which inhibit crack growth and increase the mechanical load capacity. Also, the use of oxidic layers in the cold forming sector is only possible to a limited degree since the synthesis of for example $Al_2O_3$ layers for this application area requires the production of the alpha-$Al_2O_3$ phase, which can be achieved with conventional PVD (physical vapor deposition) or CVD (chemical vapor deposition) methods only at deposition temperatures >1000° C. Due to the high deposition temperatures and the accompanying thermal warpage and hardness reduction of the tools and because of the near-net-shape requirements, these processes can only be used to a limited degree for coating cold forming tools. A coating of the gamma-$Al_2O_3$ phase at temperatures <800° C. is also only possible to a limited degree for use in cold forming since it does not procure mechanical properties and wear resistance that are comparable to those achieved by other nitridic PVD systems.

According to the invention, the surface of a cold forming tool, particularly for forming super-high-strength steels, is changed in that hard material layers with reduced friction coefficients are applied to the surface. The underlying idea is to offer better resistance to local stresses by producing property gradients on the tool surface. The surface in this case is for example provided with a higher degree of hardness while the tool substrate ensures the required degree of toughness.

In particular, according to the invention, a PVD hard material layer is deposited onto corresponding tools.

The production of PVD coatings (physical vapor deposition) has been known for a long time and is used especially for tools, in particular cutting tools.

A method that is usually used for such hard material layers is cathodic arc evaporation, also referred to as arc-PVD or arc evaporation. This method belongs to the group of physical gas-phase deposition (PVD) methods and stated more precisely, is an evaporation method.

With this method, a negative potential is applied to the cathode or the material to be evaporated; an arc is produced between the chamber wall of the vacuum chamber (correspondingly functioning as an anode) and the cathode surface. The cathode contains the material that is to be subsequently deposited, for example, onto the workpiece, in this case the tool; by means of a corresponding atmosphere in the chamber, for example, the cathode material in the plasma phase can also react with corresponding gases (reaction gases) in order to produce a corresponding layer.

In this cathodic arc evaporation, a large part of the evaporated material is ionized, during which, in a line-of-sight process, the material diffuses radially from the cathode surface. In addition, a negative potential is applied to the substrate so that the ionized metal vapor is accelerated toward the substrate. The vapor condenses on the substrate surface; as a result of the high ionization percentage and the negative bias voltage at the substrate, a high kinetic energy can be introduced into the growing layer. By means of this, it is possible among other things to influence the properties such as the layer adhesion, density, composition, and microstructure of the deposited layer.

It is known, however, that normally, aluminum chromium nitride (AlCrN) and aluminum titanium nitride (AlTiN) layers can only be applied with a high percentage of macroparticle inclusions (so-called "droplets") in the growing layer and that in the evaporation of aluminum chromium cathodes, a powerful formation of macroparticles is observed. This is manifested in so-called droplet/macroparticle inclusions in the growing thin layer and a correspondingly higher degree of layer roughness. These droplets also form in monolithic embodiments of aluminum chromium nitride and aluminum titanium nitride layers. Aluminum chromium nitride and aluminum titanium nitride layers also have a comparatively high degree of layer hardness and higher friction coefficients in actual use. The higher degrees of layer roughness and the higher friction coefficients in the region close to the surface, however, can have a disadvantageous effect during the forming of for example super-high-strength galvanized sheet steels and can lead to instances of welding buildup, which can reduce tool service life. The welding buildup is an adhesive material residue composed of softer formed material on the harder tool.

According to the invention, therefore, an additional thin titanium nitride top layer (TiN) is applied as a final layer, which due to its reduced droplet inclusions yields a more uniform, smoother layer surface. Another property of the titanium nitride top layer is its friction coefficient, which is lower than those of the underlying layers. This reduces the risk of welding buildup and thus improves the break-in behavior of the layer in comparison to the underlying harder aluminum titanium nitride and aluminum chromium nitride layers. The break-in behavior is advantageously improved by the titanium nitride top layer because of its good sliding properties and its low breakaway torque (the force, which is necessary to overcome the static friction and initiates the transition to sliding friction). Surprisingly, the titanium nitride top layer absorbs some force with each stroke since the titanium nitride top layer has a better elasticity than the hard aluminum chromium nitride and aluminum titanium nitride layers beneath it. A TiN top layer thinner than 0.1 μm does not result in an improved break-in behavior. With TiN top layers that are too thick (thicker than 0.5 μm), the underlying multilayer structure can no longer exhibit its advantageous properties such as the slower crack growth. TiN top layers with a thickness of between 0.2 and 0.3 μm can be particularly advantageous. This represents an optimum balance of good break-in properties and delayed tool damage, for example due to the inhibition of crack growth.

Instead of the titanium nitride top layer (TiN), it is also alternatively possible to provide a titanium carbon nitride top layer (TiCN). The use of a titanium nitride top layer (TiN) is preferable, for example, for the cold forming of coated ultra-high-strength sheet metals since this reduces friction due to its lower hardness in comparison to the titanium carbon nitride top layer (TiCN) and thus reduces the potential welding buildup on the coating (e.g. electrochemically galvanized with zinc) of the ultra-high-strength sheet metal on the tool. Moreover, the choice between the two top layers permits a color diversification for the user if so desired since the TiN top layer has a golden color and the TiCN top layer has a gray-blue color.

In addition, a titanium nitride adhesive layer (TiN) can be advantageously deposited onto the tool that is to be coated. This adhesive layer can result in a better bonding of the subsequent multiple layers of the coating. The TiN adhesive layer advantageously has a thickness of 0.2 to 0.9 μm. With layers thicker than 0.9 μm, internal stresses in the layer can occur that are so high that the layer adhesion deteriorates. A titanium nitride adhesive layer that is 0.4 to 0.7 μm thick turns out to be particularly advantageous; this made it possible to achieve the best layer adhesion. The upper limit can also be selected to be 0.9, 0.8, 0.7, or 0.6 μm thick. The lower limit can also be selected to be 0.2, 0.3, 0.4, or 0.45 μm thick.

For the application of the individual layers of the multilayer coating, preferably aluminum chromium, aluminum titanium, and titanium cathodes are used, with nitrogen being used as a reactive gas, in order to deposit aluminum titanium nitride or aluminum chromium nitride layers (AlTiN—AlCrN multilayer systems). These nitride hard material layers, due to their mechanical and thermal properties, can produce wear-minimizing and local thermal effects with respect to the extreme contact stresses in the normal direction. It has turned out to be advantageous to first deposit an aluminum titanium nitride layer onto the optional TiN adhesive layer. It is thus possible to improve the bonding of the subsequent multiple layers.

The interplay of layers with different mechanical and thermal properties is advantageous among other things in order to reduce crack propagation. In this connection, the inventors have discovered that 5 layers each of AlCrN+AlTiN (i.e. a total of 10 layers) can effectively reduce crack propagation. But too many layers have the disadvantage that with increasing layer thickness, the internal stresses in the applied layer can become high enough that layer adhesion problems can occur. It has advantageously turned out that for this purpose, the number of alternating layers should not exceed 20 pairs (i.e. a total of 40- or 42 with a TiN adhesive layer and a TiN or alternatively TiCN top layer). The upper limit for alternating layer pairs can also be selected to be 20, 18, 16, 14, or 12 layers of AlCrN and AlTiN. The lower limit for alternating layer pairs can also be selected to be 5, 6, 7, 8, 9, or 10 layers of AlCrN+AlTiN.

The individual aluminum titanium nitride layers can advantageously each be 0.1 to 0.5 µm thick. With layers thinner than 0.1 µm, it may not be possible to achieve the desired properties (somewhat more elastic than AlCrN) of the hard material layer. Thicker layers, particularly those over 0.5 µm thick, can have internal stresses that are so high that the layer adhesion deteriorates. Layer thicknesses of between 0.2 and 0.3 µm can be particularly advantageous since they can already have a functional effect without introducing excessively high internal stresses. The upper limit can also be selected to be 0.50, 0.40, 0.35, or 0.30 µm thick. The lower limit can also be selected to be 0.10, 0.15, or 0.20 µm thick.

The individual aluminum chromium nitride layers can advantageously each be 0.1 to 0.5 µm thick. With layers thinner than 0.1 µm, it may not be possible to achieve the desired properties (resistance to abrasive wear, very hard, tougher than AlTiN, high degree of hot hardness—temperature stability up to approx. 900° C.) of the hard material layer. Thicker layers, particularly those over 0.5 µm thick, can have internal stresses that are so high that the layer adhesion deteriorates. Layer thicknesses of between 0.2 and 0.3 µm can be particularly advantageous since they can already have a functional effect without introducing excessively high internal stresses. The upper limit can also be selected to be 0.50, 0.40, 0.35, or 0.30 µm thick. The lower limit can also be selected to be 0.10, 0.15, or 0.20 µm thick.

In a particularly advantageous embodiment, a layer thickness combination of 0.2 to 0.3 µm for each aluminum chromium nitride and aluminum titanium nitride layer is selected. Through the interplay of somewhat more elastic layers and somewhat tougher layers, it is possible, for example, to slow crack growth and thus to ensure a longer service life of the tool.

The overall layer thickness can be between 1.5 and 21 µm. Preferably, the overall layer thickness is 10 to 11 µm. Preferably, the thickness of the AlTiN—AlCrN multilayer system is more than 5 µm since this slows the crack propagation.

The chemical composition of the layers is 40 to 50 at % (atom-%) titanium and 50 to 60 at % nitrogen in the titanium nitride (adhesive layer and top layer), 20 to 23 at % carbon, 30 to 33 at % nitrogen, and 44-50 at % titanium in the titanium carbon nitride (alternative top layer), 30 to 40 at % aluminum, 10 to 20 at % chromium, and 45 to 55 at % nitrogen in the aluminum chromium nitride, and 8 to 14 at % aluminum, 30 to 40 at % titanium, and 40 to 50 at % nitrogen in the aluminum titanium nitride. In other words: $Ti_zN_{1-z}$, where z=0.4 to 0.6, $Ti_xC_yN_{1-(x+y)}$, where x=0.44 to 0.50 y=0.20 to 0.23, and the rest is nitrogen, $Al_aCr_bN_{1-(a+b)}$, where a=0.30 to 0.40, b=0.10 to 0.20, and the rest is nitrogen, and $Al_cTi_dN_{1-(c+d)}$, where c=0.08 to 0.14, d=0.30 to 0.40, and the rest is nitrogen.

The layer structure according to the invention on the cold forming tool can be deposited with a duplex method (in-situ plasma nitriding and subsequent PVD coating). Preferred substrates include all materials that can be plasma nitrided, in particular metal materials, especially HSS (high speed steel) and carbide metal. For purposes of this disclosure, the metal material that is to be coated is referred to as the substrate. The applicant produces the alpha 400P and alpha 900P coating systems for this purpose. In the duplex method, the two work steps (plasma nitriding and PVD coating) are performed one after another in one process without having to ventilate the system in between them. In the plasma nitriding, nitrogen diffuses into the boundary zone, which increases the surface hardness of the tool material. The formation of unwanted compound layers is suppressed in this case. It is thus possible to optimally prepare the workpiece (good supporting effect) for the subsequent hard, brittle PVD coating.

The invention thus relates to a method for producing a cold forming tool, particularly for cold forming super-high-strength steels, wherein the cold forming tool is the upper and/or lower tool of a forming tool set, wherein the cold forming tool is made of a metal material and has a forming surface that is designed so that a formed metal sheet has the desired final contour of the component, wherein that a hard material layer is deposited on the forming surface of the forming tool by means of physical gas-phase deposition, wherein the hard material layer consists of a titanium nitride adhesive layer and alternating layers of aluminum titanium nitride and aluminum chromium nitride deposited thereon, wherein a titanium nitride top layer or titanium carbon nitride top layer is deposited as the final layer as the outermost outer surface oriented toward a workpiece that is to be formed.

According to another advantageous embodiment, as the first layer of the alternating deposited layers, first an aluminum titanium nitride layer is deposited onto the titanium nitride adhesive layer.

In another advantageous embodiment, five to twenty alternating layer pairs are deposited onto the titanium nitride adhesive layer before a final titanium nitride top layer or titanium carbon nitride top layer is deposited.

It is advantageous if the titanium nitride adhesive layer (2) has a thickness of 0.2 micrometers to 0.9 micrometers, preferably from 0.4 micrometers to 0.7 micrometers.

It is likewise advantageous if the aluminum titanium nitride layers (3) have a thickness of 0.1 to 0.5 micrometers, preferably from 0.2 to 0.3 micrometers.

The aluminum chromium nitride layers (4) advantageously have a thickness of 0.1 to 0.5 micrometers, preferably from 0.2 to 0.3 micrometers.

In another embodiment, the final titanium nitride top layer (5) or a titanium carbon nitride top layer has a thickness of 0.2 to 0.5 micrometers, preferably from 0.2 to 0.3 micrometers.

In another advantageous embodiment, the chemical composition of the layers is as follows: adhesive layer and top layer $Ti_zN_{1-z}$ where z=0.4 to 0.6, as an alternative top layer $Ti_xC_yN_{1-(x+y)}$, where x=44 to 50, y=20 to 23, and the rest is nitrogen, $Al_aCr_bN_{1-(a+b)}$, where a=30 to 40, b=10 to 20, and the rest is nitrogen, and $Al_cTi_dN_{1-(c+d)}$, where c=8 to 14, d=30 to 40, and the rest is nitrogen.

The invention also relates to a cold forming tool, which has a hard material coating that is deposited according to the above-described method.

According to an advantageous embodiment, the hard material layer is composed of alternating aluminum titanium nitride layers (3) and aluminum chromium nitride layers (4), with a final titanium nitride top layer (5) or a titanium carbon nitride top layer.

In another advantageous embodiment, there is a titanium nitride adhesive layer (2) as a first layer on the tool, followed by the aluminum titanium nitride layers (3) and aluminum chromium nitride layers (4) and the final titanium nitride top layer (5) or a titanium carbon nitride top layer.

The invention will be explained by way of example based on the drawings. In the drawings:

FIG. 1 shows a sample layer structure with a titanium nitride adhesive layer 2 on a substrate 1 containing 15 layers each of alternating aluminum titanium nitride layers 3 and aluminum chromium nitride layers 4 and a titanium nitride top layer 5 in a first embodiment;

Figure 1:
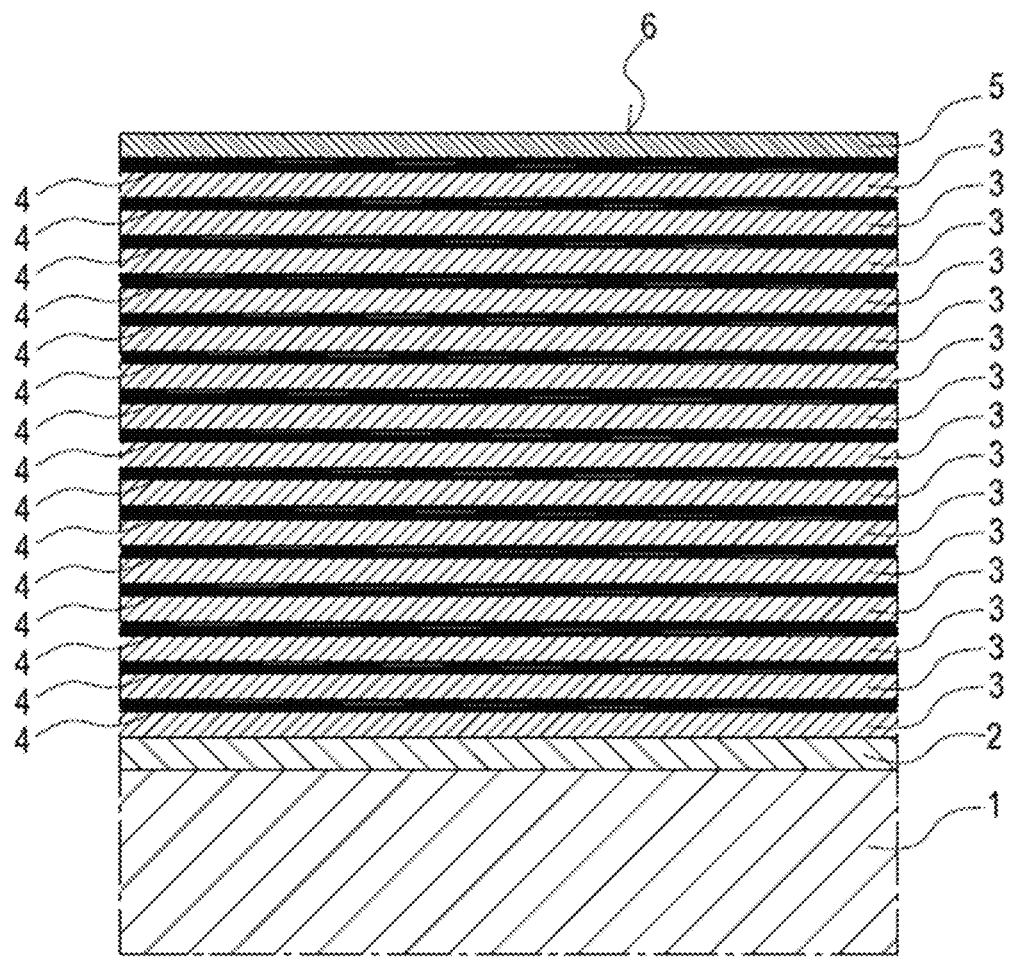
Figure 1:
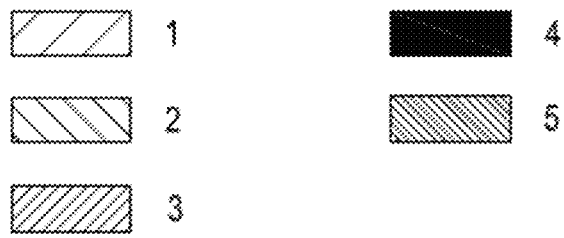

FIG. 1 shows a sample layer construction with a titanium nitride adhesive layer 2 on a substrate 1 containing 15 layers each of alternating aluminum titanium nitride layers 3 and aluminum chromium nitride layers 4 and a titanium nitride top layer 5 in a first embodiment, wherein the titanium nitride adhesive layer 2 is followed directly by an aluminum titanium nitride layer 3.

Figure 2:
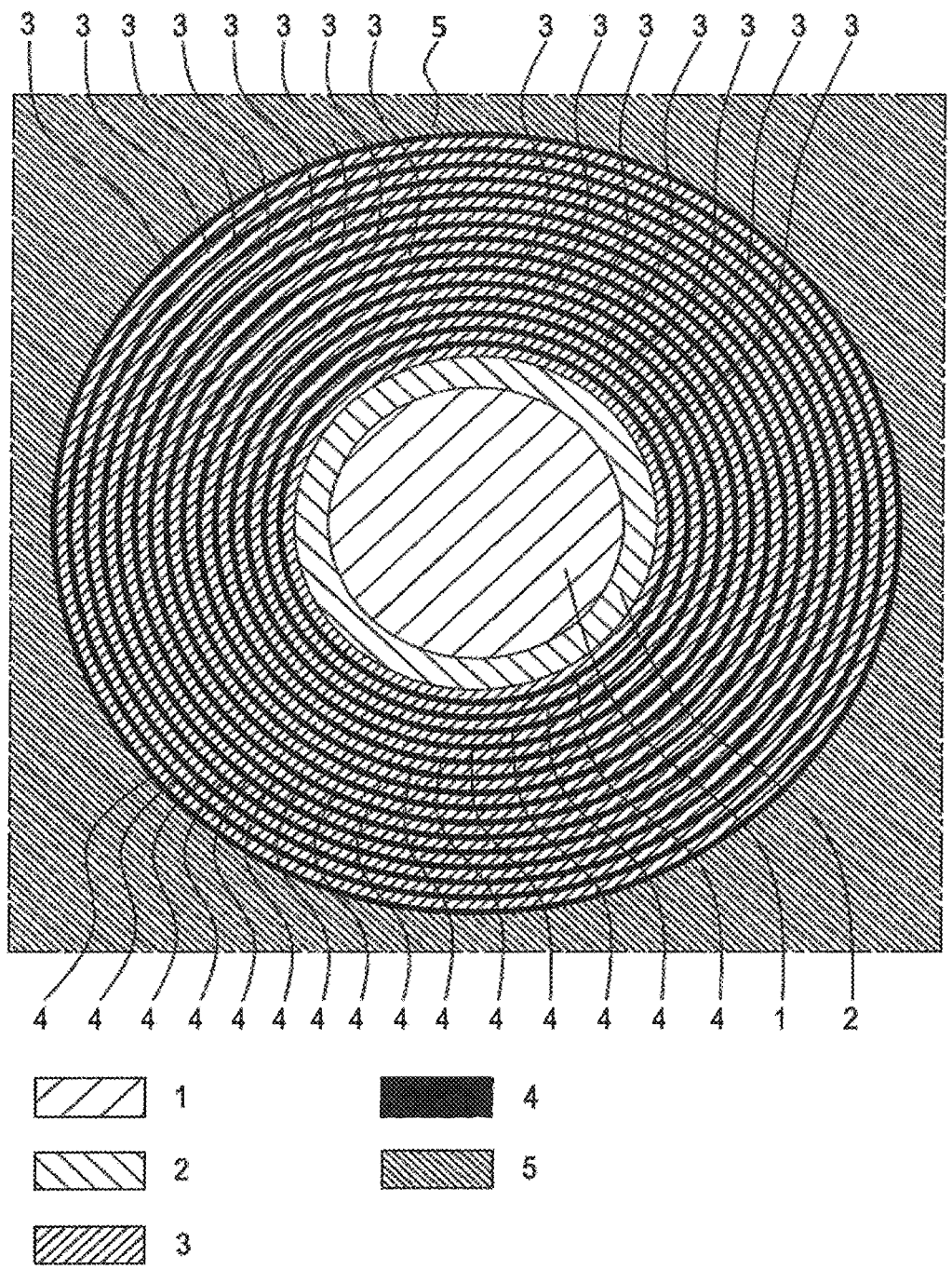
FIG. 2 shows an abstract calotte grinding, i.e. a top view in which the individual layers are visible.

FIG. 2 shows an abstract calotte grinding. In the calotte grinding, a ball grinds a calotte (spherical cap) into the surface. If the multilayer structure is ground through to the substrate, then the substrate is visible in the innermost circle. The sample layer structures are visible. First, the substrate 1 has a titanium nitride adhesive layer 2 applied to it, which improves the adhesion between the subsequent layers and the substrate 1. The titanium nitride adhesive layer 2 is advantageously followed directly by an aluminum titanium nitride layer 3. Then come alternating aluminum titanium nitride layers 3 and aluminum chromium nitride layers 4; these layers are deposited 15 times each and finally, a titanium nitride top layer 5 is deposited.

Figure 3:
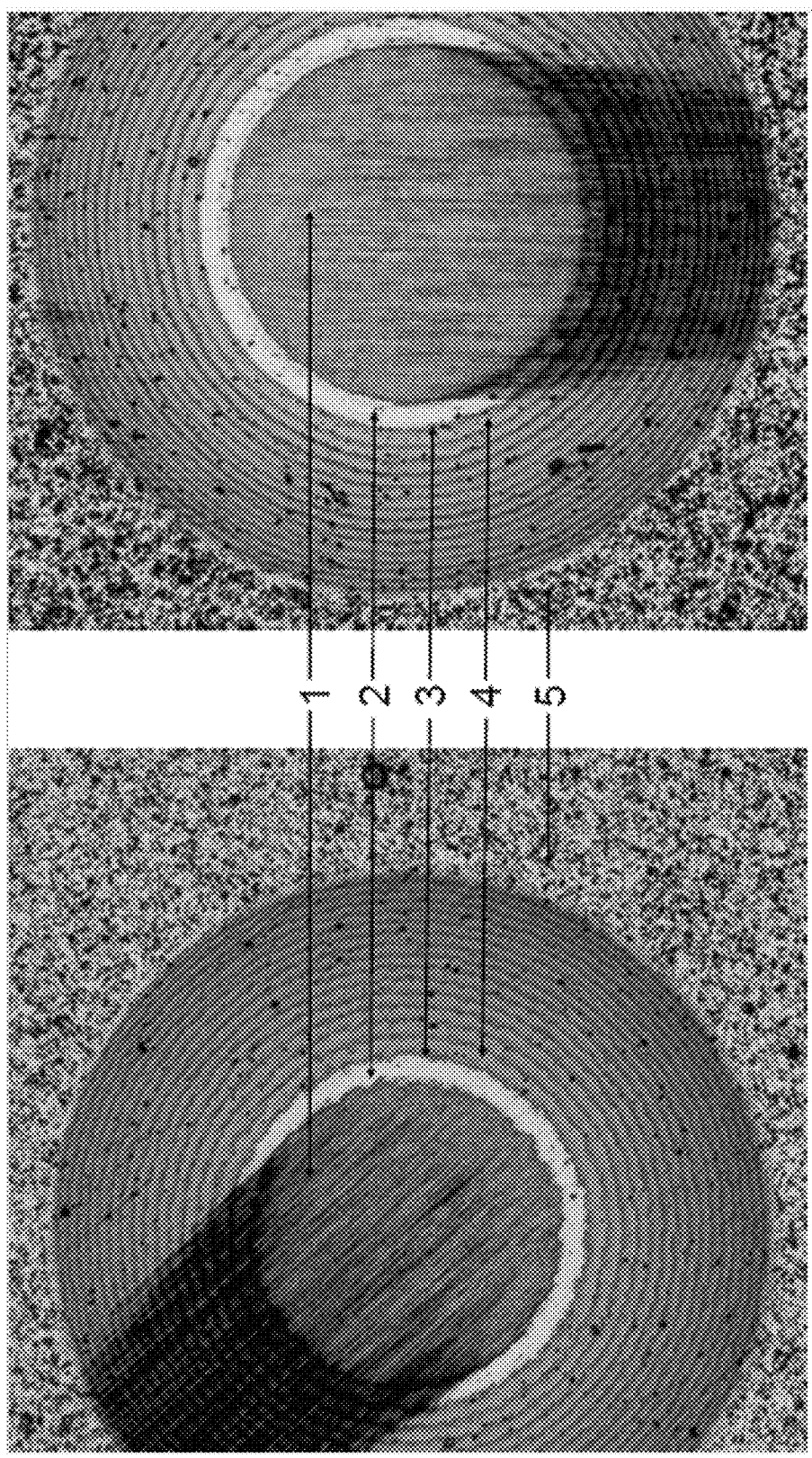
FIG. 3 shows a metallographic comparison of sample layers by means of a calotte grinding, which were deposited onto a specimen using two different systems.

FIG. 3 shows the metallographic calotte grindings of two sample layer structures, which have been deposited onto a cylindrical test specimen composed of the corresponding steel material. The layer structure is the same as in FIG. 2. The coating system on the left was applied using an alpha 400P coating system produced by the applicant and the coating system on the right was applied using an alpha 900P coating system produced by the applicant.

The figures do not depict an exemplary use of a titanium carbon nitride top layer instead of a titanium nitride top layer.

The invention will be explained below based on a specific example:

The chemical composition of the layers in the example consists of approx. 45 at % titanium and approx. 55 at % nitrogen in the titanium nitride, approx. 35 at % aluminum, approx. 15 at % chromium, and approx. 50 at % nitrogen in the aluminum chromium nitride, whereas approx. 11 at % aluminum, 35 at % titanium, and 45 at % nitrogen are contained in the aluminum titanium nitride.

A coating for cold forming tools is produced in the form of a multilayer hard material coating, which, starting from the substrate 1 (tool base material, metal material) and using PVD-ARC technology, is deposited as a sequence of a TiN adhesive layer 2, an AlTiN—AlCrN multilayer system (15 individual layers of each), and a TiN top layer 5 and is able to improve the service life of the cold forming tool. The optimization of the tool service life is achieved in that the PVD arc-based AlTiN—AlCrN multilayer system, because of its mechanical and thermal properties, produces wear-minimizing and local thermal effects with respect to the extreme contact stresses in the normal direction during forming. The additional thin TiN top layer 5 benefits the break-in behavior of the layer and reduces the friction in comparison to the underlying harder AlTiN—AlCrN multilayer structure.

The 0.5 μm-thick TiN adhesive layer 2 is deposited with an increasing substrate temperature ramp from 400 to 450° C., a decreasing substrate bias voltage of 600-220 V, and a vaporizer current of 60 A with the aid of the reaction gas $N_2$ at $1.2*10^{-2}$ mbar. The composition of the TiN adhesive layer 2 is as follows, within the measurement uncertainty: 45 at % Ti and 55 at % Al.

The 0.2 to 0.3 μm-thick AlTiN layer 3 of the AlTiN—AlCrN multilayer system starts with an AlTiN layer with a high Ti concentration, which is deposited at a substrate temperature of 450° C. and a substrate bias voltage of 200 V, with a simultaneous deposition of AlTi cathodes at 55 A and Ti cathodes at 60 A with the aid of the reaction gas $N_2$ at $2*10^{-2}$ mbar. The composition of the AlTiN individual layer is as follows, within the measurement uncertainty: 11 at % Al, 35 at % Ti, and 54 at % N.

The overlying 0.2 to 0.3 μm-thick AlCrN layer 4 of the AlTiN—AlCrN multilayer system is deposited at a substrate temperature of 450° C., a substrate bias voltage of 80 V, and an AlCr cathode current of 105 A with the aid of the reaction gas $N_2$ at $2*10^{-2}$ mbar. The composition of the AlCrN individual layer 4 is as follows, within the measurement uncertainty: 35 at % Al, 15 at % Ti, and 50 at % N.

The individual layers of AlTiN 3 and AlCrN 4 are applied 15 times one after another and produce the above-mentioned AlTiN—AlCrN multilayer system.

The 0.2 μm-thick TiN top layer 5 is deposited with an increasing substrate temperature of 450° C., a substrate bias voltage of 80 V, and a Ti cathode current of 60 A with the aid of the reaction gas $N_2$ at $2*10^{-2}$ mbar. The composition of the TiN top layer 5 is as follows, within the measurement uncertainty: 45 at % Ti and 55 at % Al.

The layer thickness of the overall layer composite in the example is 5-7 μm. The forming surface 6 is the tool surface that is oriented toward the workpiece.

The layer properties relating to tool service life were determined on a stamping tool since stamping tests and the parameters associated with them are better defined than forming tests. All of the stamping tests were performed on an eccentric press (four pillar eccentric press, 15,000 kg). A respective stamping tool was coated that was made of cold work steel (with 0.7 wt % carbon, 5 wt % chromium, 2.3 wt % Mo, 0.5 wt % vanadium, and 0.5 wt % manganese, 0.2 wt % Si, with a hardness of 60 to 61 HRc). It was used to stamp a 1.5 mm-thick sheet composed of super-high-strength steel with a tensile strength of 1400 MPa without additional lubrication.

Stamping Parameters:
  Stroke rate: 160-170 strokes/minute
  Feed rate (with 1.5 mm-thick steel sheet): 8 m/min
  Pressure: 72,500-74,000 N The service life was measured in comparison to an aluminum titanium nitride-based reference layer and tool failure or the burr height on the stamped workpiece/component was used as an abort criterion. In other words, if tool failure occurs, then the wear in the edge regions of the tool is high enough that a critical burr height is reached on the workpiece/steel sheet. In this case, the aluminum titanium nitride-based reference layer reached a critical burr height at 65,000 strokes and the tool that is coated according to the invention reached the critical burr height only after 365,000 strokes. This corresponds to extending the service life by a factor of 5.

Instead of the TiN top layer, it is also possible to use a TiCN top layer. The 0.2 μm-thick TiCN top layer can be deposited with an increasing substrate temperature of 450° C., a falling substrate bias voltage from 150 V to 50 V, and a falling Ti cathode current from 60 A to 42 A with the aid of the reaction gases $N_2$ and $CH_4$ at $1.2*10^{-2}$ mbar. The composition of the TiCN top layer is as follows, within the measurement uncertainty: 20 to 23 at % C, 30-33 atomic percent $N_2$, and 44-50 at % Ti.

With the invention, it has been advantageously possible to significantly increase the service life of a tool with the multilayer structure according to the invention.

REFERENCE NUMERAL LIST 1 metal material, substrate (tool to be coated)
2 titanium nitride adhesive layer (TiN adhesive layer)
3 aluminum titanium nitride layers (AlTiN layer)
4 aluminum chromium nitride layers (AlCrN layer)
5 titanium nitride top layer (TiN top layer)
6 forming surface

The invention claimed is:

1. A method for producing a cold forming tool to cold form super-high-strength steels, wherein the cold forming tool is an upper and/or lower tool of a forming tool set, wherein the cold forming tool is made of a metal material and has a forming surface, the method comprising
   depositing a hard material layer on the forming surface of the cold forming tool by physical gas-phase deposition, wherein the hard material layer comprises a titanium nitride adhesive layer and alternating layers of aluminum titanium nitride and aluminum chromium nitride deposited thereon,
   depositing a titanium nitride top layer or titanium carbon nitride top layer as the final layer as the outermost outer surface oriented toward a workpiece that is to be formed by the tool; and
   wherein the titanium nitride adhesive layer and the titanium nitride top layer have a formula $Ti_zN_{1-z}$, wherein z=0.4 to 0.6; or the titanium carbonitride as an alternative top layer has a formula $Ti_xC_yN_{1-(x+y)}$, wherein x=0.44 to 0.50, y=0.20 to 0.23, and the rest is nitrogen;
   wherein the aluminum chromium nitride layer has a formula $Al_aCr_bN_{1-(a+b)}$, wherein a=0.30 to 0.40, b=0.10 to 0.20, and the rest is nitrogen; and
   wherein the aluminum titanium nitride layer has a formula $Al_cTi_dN_{1-(c+d)}$, wherein c=0.08 to 0.14, d=0.30 to 0.40, and the rest is nitrogen.

2. The method of claim 1, wherein as the first layer of the alternating deposited layers, a first aluminum titanium nitride layer is deposited onto the titanium nitride adhesive layer.

3. The method of claim 1, wherein five to twenty alternating layers of aluminum titanium nitride and titanium nitride adhesive layers are deposited onto the titanium nitride adhesive layer before a final top layer of titanium nitride or titanium carbon nitride is deposited.

4. The method of claim 1, wherein the titanium nitride adhesive layers have a thickness of 0.2 micrometers to 0.9 micrometers.

5. The method of claim 1, wherein the titanium nitride adhesive layers have a thickness of 0.4 micrometers to 0.7 micrometers.

6. The method of claim 1, wherein the aluminum titanium nitride layers have a thickness of 0.1 to 0.5 micrometers.

7. The method of claim 1, wherein the aluminum chromium nitride layers have a thickness of from 0.2 to 0.3 micrometers.

8. The method of claim 1, wherein the final titanium nitride top layer or a titanium carbon nitride top layer has a thickness of 0.2 to 0.5 micrometers.

9. The method of claim 1, wherein the final titanium nitride top layer or a titanium carbon nitride top layer has a thickness of from 0.2 to 0.3 micrometers.

* * * * *